(12) United States Patent
Komori et al.

(10) Patent No.: US 7,734,273 B2
(45) Date of Patent: Jun. 8, 2010

(54) FREQUENCY MIXER DEVICE AND METHOD FOR COMPENSATING DC OFFSET

(75) Inventors: Hiroshi Komori, Otsu (JP); Masatoshi Igarashi, Souraku-gun (JP); Takeaki Watanabe, Mukou (JP)

(73) Assignee: Panasonic Corporation, Osaka (JP)

( * ) Notice: Subject to any disclaimer, the term of this patent is extended or adjusted under 35 U.S.C. 154(b) by 882 days.

(21) Appl. No.: 11/195,286

(22) Filed: Aug. 2, 2005

(65) Prior Publication Data

US 2006/0030288 A1    Feb. 9, 2006

(51) Int. Cl.
*H04B 1/16* (2006.01)
(52) U.S. Cl. .................... 455/334; 455/226.1; 455/324; 455/333
(58) Field of Classification Search ............... 455/232.1, 455/240.1, 250.1, 234.1, 310, 317, 324, 226.1, 455/323, 333, 334, 339, 341; 375/345; 327/309–311, 327/307
See application file for complete search history.

(56) References Cited

U.S. PATENT DOCUMENTS

| 5,898,912 | A | * | 4/1999 | Heck et al. ............... 455/234.2 |
| 6,040,731 | A | | 3/2000 | Chen et al. |
| 6,535,725 | B2 | * | 3/2003 | Hatcher et al. ............... 455/317 |
| 7,184,730 | B2 | * | 2/2007 | Hughes et al. ........... 455/240.1 |
| 7,203,476 | B2 | * | 4/2007 | Ruelke et al. ................ 455/324 |
| 7,257,379 | B2 | * | 8/2007 | Ozluturk et al. ................ 455/73 |
| 2003/0139161 | A1 | * | 7/2003 | Wieck ..................... 455/234.1 |
| 2004/0014450 | A1 | * | 1/2004 | Yamamoto et al. .......... 455/307 |
| 2004/0152432 | A1 | * | 8/2004 | Gu .............................. 455/136 |
| 2005/0250459 | A1 | * | 11/2005 | Tervaluoto et al. ....... 455/127.2 |

* cited by examiner

*Primary Examiner*—Nhan Le
(74) *Attorney, Agent, or Firm*—Hamre, Schumann, Mueller & Larson, P.C.

(57) ABSTRACT

A frequency mixer device is provided with a mixer circuit having an input cell that amplifies an input signal and a switching cell that mixes the amplified input signal with a switching signal and outputs a multiplied signal, and a DC offset compensator that detects the input level of the input signal and outputs a compensation signal based on that detection signal, the compensation signal being supplied to the mixer circuit so as to compensate a DC offset included in the multiplied signal. The compensation signal that the DC offset compensator outputs is added to the output signal of the input cell so as to compensate the DC offset. Low frequency noise included in the compensation signal is converted to a frequency near that of the switching signal, and does not range over the desired waveband of the mixer output.

20 Claims, 5 Drawing Sheets

US 7,734,273 B2

FREQUENCY MIXER DEVICE AND METHOD FOR COMPENSATING DC OFFSET

BACKGROUND OF THE INVENTION

1. Field of the Invention

The present invention relates to DC offset compensation in a frequency mixer device that mixes an input signal and a switching signal, and outputs a multiplied signal. It is particularly related to a frequency mixer device having a DC offset compensating function suitable for compensating DC offset generated when an interfering waveband signal is input when using a direct conversion wireless receiver, and a method for compensating the DC offset.

2. Description of Related Art

In recent years, technology that uses a direct-conversion system has been proposed in connection with the miniaturization and price reduction of wireless receivers. In this system an input RF (wireless frequency) signal is converted directly to a low frequency baseband signal, and so in comparison to a super heterodyne system that requires a high frequency IF (intermediate frequency) signal, it has the advantage that an intermediate frequency filter becomes unnecessary. A direct conversion system is also referred to as a zero IF system, because the center frequency of the IF signal is DC.

Frequency conversion is performed by mixing (compositing) the frequency of an input RF signal with a local signal having the same frequency using a mixer circuit. However, in a direct conversion system, when the input signal level is large, DC offset occurs in the output baseband signal when second order nonlinear distortion is present in the mixer circuit. This condition will be explained in detail with reference to FIG. 7 and FIG. 8.

FIG. 7 shows the spectrum of an input RF signal, with numeral 101 denoting a weak-level desired waveband signal with the center frequency being the same as a local signal frequency $f_{LO}$, and numeral 102 indicating a high-level interfering waveband signal that is present at a higher frequency $f_{INT}$. As a result of inputting an RF signal that accompanies this sort of high-level interfering waveband signal to a mixer circuit, the spectrum of the output signal appearing in the mixer output becomes as shown in FIG. 8. Numerals 103 and 104 respectively indicate the components that appear in the mixer output after frequency conversion of the desired waveband signal 101 and the interfering waveband signal 102 of the RF input. Numeral 105 indicates the DC offset generated by the high-level interfering waveband signal when second order nonlinear distortion is present in the mixer circuit.

Accordingly, in a direct conversion system, there is the problem that receiver sensitivity decreases due to the DC offset 105 generated in the frequency range of the desired waveband signal 103 of the mixer output. If the mixer circuit is composed of a differential circuit and the differential balance is completely symmetrical, second order nonlinear distortion will not be present. However, because the components constituting the differential circuit cannot be made completely symmetrical due to manufacturing irregularities, it is not possible to eliminate second order nonlinear distortion. Therefore, technology has been proposed that compensates the DC offset generated by second order nonlinear distortion.

A method for detecting an interfering waveband signal included in the input RF signal and compensating DC offset generated in the mixer output, disclosed in U.S. Pat. No. 6,535,725, is explained below with reference to FIG. 9.

In FIG. 9, numeral 106 indicates a mixer circuit, which is composed of a switching cell 107 and an RF input cell 108. The switching cell 107 is composed of bipolar transistors Q1, Q2, Q3, and Q4. The RF input cell 108 is composed of bipolar transistors Q5 and Q6, and resistors R. The RF signal input from RF input terminals 109 and 110 is amplified by the RF input cell 108. The amplified RF signal is converted to an IF signal by being mixed with a local signal input from local input terminals 111 and 112 in the switching cell 107, and this converted IF signal is output from output terminals 113 and 114.

If all of the transistors Q1, Q2, Q3, and Q4 constituting the switching cell 107 have exactly the same characteristics, balance as a differential circuit will be completely symmetrical. However, because the bipolar transistors Q1, Q2, Q3, and Q4 each individually have properties that differ from the ideal properties due to manufacturing irregularities, second order nonlinear distortion is generated when the input RF signal is converted to an IF signal. Therefore, DC offset is generated in the mixer output as shown in FIG. 8. As is well known, because the DC offset is proportional to the square of the input signal strength, the higher the level of the interfering waveband signal included in the input signal, the greater the output DC offset will become.

On the other hand, the circuit shown in FIG. 9 is provided with a DC offset compensator 115. The DC offset compensator 115 is composed of a detector 116, a controller 117, and a correction generator 118. The detector 116 detects an input RF signal and outputs a detection signal. The controller 117 generates a control signal in response to the detection signal. The correction generator 118 generates a compensation signal in response to the control signal from the controller 117 such that it reduces the DC offset of the mixer output terminals 113 and 114. By this operation of the DC offset compensator 115, the compensation signal that the correction generator 118 outputs to the mixer circuit 106 changes in response to the strength of the RF signal input, and the DC offset of the mixer output is cancelled. Further, in the mixer circuit 106, because the second order nonlinear distortion properties of each individual element differ due to manufacturing irregularities, a function of a user interface 119 is also provided in the DC offset compensator 115 in order to adjust the control signal produced by the controller 117.

However, in the method that adds a compensation signal in order to compensate the DC offset included in the mixer output signal, a low frequency noise generated within the DC offset compensator is superimposed on the compensation signal that is used. Therefore, not only the DC offset included in the mixer output signal being compensated, but also a noise signal is newly added in the frequency range of the desired waveband signal. In order to explain this condition, the spectrum of the mixer output after DC offset compensation is shown in FIG. 10. Numerals 103 and 104 respectively indicate the desired waveband signal and the interfering waveband signal appearing in the mixer output after frequency conversion in the mixer circuit, as shown in FIG. 8. A numeral 120 indicates the low frequency noise included in the compensation signal generated by the DC offset compensator, which ranges over the desired waveband. Therefore, the degradation of receiving sensitivity when inputting a high-level interfering waveband signal is not improved even when DC offset is compensated.

SUMMARY OF THE INVENTION

Therefore, with the foregoing in mind, it is an object of the present invention to provide a frequency mixer device that can compensate DC offset such that low frequency noise included in the DC offset compensation signal does not range over the desired waveband of the mixer output, and a DC offset compensating method, that solve the problems in the conventional technology described above.

A frequency mixer device according to the present invention is provided with a mixer circuit having an input cell that amplifies an input signal, and a switching cell that mixes the amplified input signal with a switching signal and outputs a multiplied signal; and a DC offset compensator that detects the input level of the input signal and outputs a compensation signal based on that detection signal, the compensation signal being supplied to the mixer circuit so as to compensate a DC offset included in the multiplied signal. In order to realize the objective described above, the compensation signal that the DC offset compensator outputs is added to the output signal of the input cell so as to compensate the DC offset.

A method according to the present invention is for compensating a DC offset included in a multiplied signal obtained by amplifying an input signal by an input cell and mixing the amplified input signal with a switching signal by a switching cell. In order to achieve the objective described above, the method includes: detecting a level of the input signal; generating a compensation signal for compensating the DC offset based on the level detection signal; supplying the compensation signal to the input cell, the compensation signal being added to the amplified input signal; and mixing the output of the input cell with the switching signal by the switching cell, so as to output the multiplied signal.

With the configuration described above, the low frequency noise included in the DC offset compensation signal is converted in the mixer output to a frequency near that of the switching signal, and therefore it is possible to compensate the DC offset such that the low frequency noise does not range over the desired waveband of the mixer output.

DETAILED DESCRIPTION OF THE INVENTION

In the frequency mixer device of the present invention, a configuration may be adopted wherein an RF signal is input as an input signal, a local signal is supplied to a switching cell as a switching signal, and an IF signal is output as a multiplied signal that is output from the switching cell.

The DC offset compensator may include a detector that detects an RF signal and outputs the detection signal; and a controller that receives the detection signal and generates a compensation signal, wherein the controller is adjustable such that the DC offset included in the IF signal is minimized by the compensation signal.

The mixer circuit can be composed of a Gilbert cell.

The input cell may include bipolar transistors into which the input signals are input, so as to compose a bipolar amplifier wherein the amplified input signal is output from a collector terminal of the bipolar transistor. In this case, the compensation signal that the DC offset compensator outputs may be input to a collector terminal of the bipolar amplifier. Alternatively, the compensation signal that the DC offset compensator outputs may be input to an emitter terminal of the bipolar amplifier. Alternatively, the compensation signal that the DC offset compensator outputs may be input to a base terminal of the bipolar amplifier.

The input cell may include MOSFETs into which the input signal is input, so as to compose a MOSFET amplifier wherein the amplified input signal is output from a drain terminal of the MOSFET. In this case, the compensation signal that the DC offset compensator outputs may be input to a drain terminal of the MOSFET amplifier. Alternatively, the compensation signal that the DC offset compensator outputs may be input to a source terminal of the MOSFET amplifier. Alternatively, the compensation signal that the DC offset compensator outputs may be input to a gate terminal of the MOSFET amplifier.

In the method of the present invention, it is possible that an RF signal is input as the input signal, a local signal is supplied to a switching cell as the switching signal, and an IF signal is output from the switching cell as the multiplied signal.

It is also possible that the level of the input signal is detected by a detector to output the level detection signal, the level detection signal is input to a controller to generate the compensation signal that compensates the DC offset included in the multiplied signal, and the controller is capable of being adjusted such that the DC offset included in the multiplied signal is minimized by the adjusting signal.

Hereinafter, the present invention will be described by way of illustrative embodiments with reference to the drawings.

Figure 1:
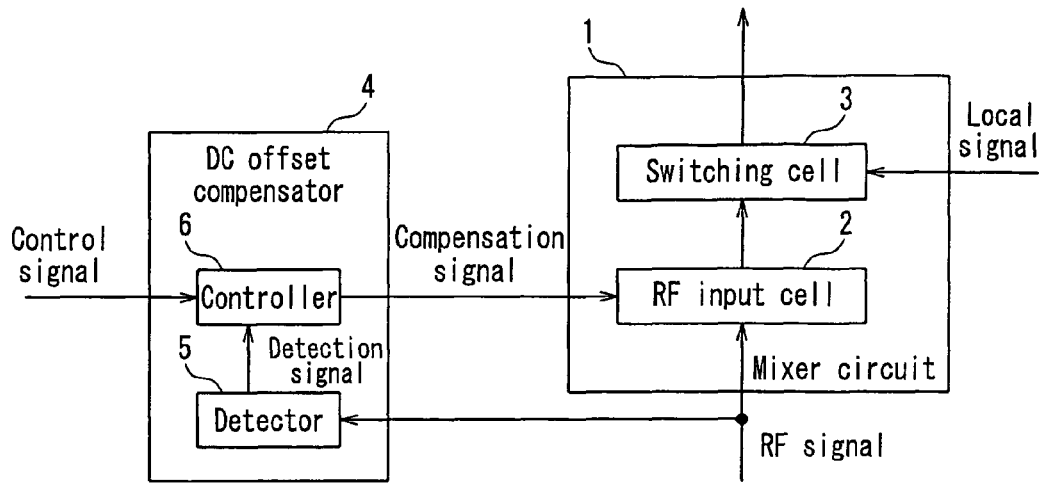
FIG. 1 is a structural overview diagram of the frequency mixer device according to an embodiment of the present invention.

FIG. 1 is a structural overview diagram of the frequency mixer device according to an embodiment of the present invention. In FIG. 1, numeral 1 indicates a mixer circuit, configured of an RF input cell 2 and a switching cell 3. An input RF signal is amplified by the RF input cell 2, the amplified RF signal is converted to an IF signal by mixing it with a local signal in the switching cell 3, and this converted IF signal is output to a stage downstream of the mixer circuit 1.

Numeral 4 indicates a DC offset compensator, comprising a detector 5 and a controller 6. The detector 5 detects the input level of the input RF signal and outputs a detection signal. The controller 6 receives the detection signal, and adjusts the level of that signal to generate a compensation signal. The compensation signal is led to the RF input cell 2, and a signal wherein the compensation signal is superimposed on the RF signal is input to the switching cell 3. Due to second order nonlinear distortion of the mixer circuit 1, a high-level interfering waveband signal included in the RF signal causes a DC offset to be generated in the mixer output signal, but the compensation signal input to the RF input cell 2 operates in the switching cell 3, so as to cause the DC offset in the mixer output to be decreased.

Figure 2:
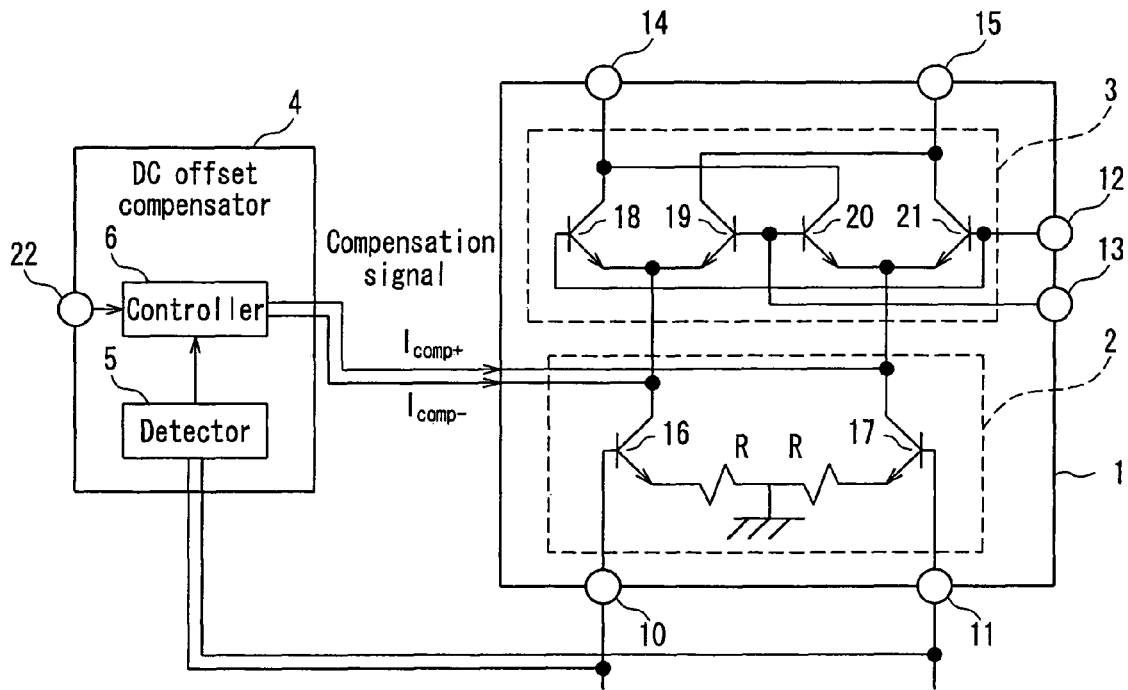
FIG. 2 is an internal circuit structure diagram of the same frequency mixer device.

The matters stated above now will be explained in detail with reference to the inside circuit structure diagram of the frequency mixer device shown in FIG. 2. In FIG. 2, numerals 10 and 11 indicate RF input terminals, numerals 12 and 13 indicate local input terminals, and numerals 14 and 15 indicate output terminals. The RF input cell 2 includes transistors 16 and 17 and resistors R, and the RF input terminals 10 and 11 are connected to the base of the transistors 16 and 17. The switching cell 3 includes transistors 18, 19, 20, and 21 and configures a Gilbert cell in combination with the RF input cell 2.

Figure 9:
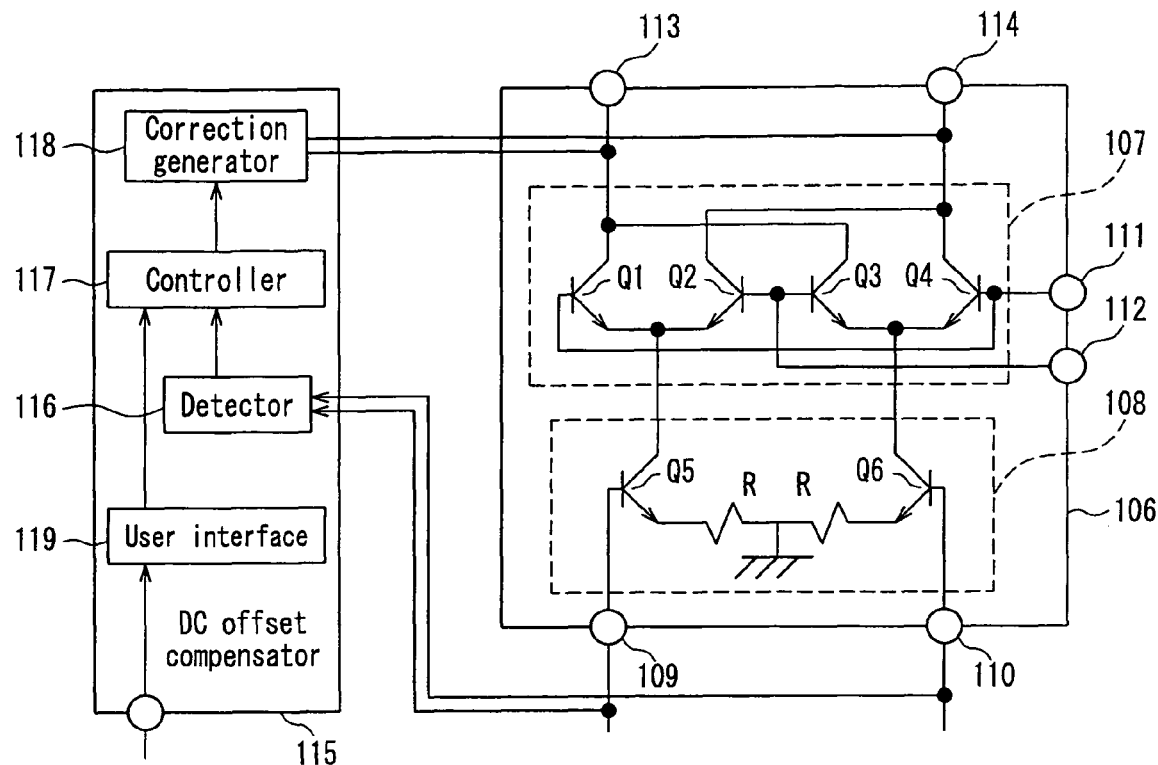
FIG. 9 is an internal circuit structure diagram of a frequency mixer device according to the conventional technology.

The RF signal inputs to the RF input terminals 10 and 11 are subjected to frequency conversion and are output to the output terminals 14 and 15. When doing so, second order nonlinear distortion occurs and a DC offset is generated in the output signal because of mismatch due to manufacturing irregularities of the transistors 18 to 21 that constitute the switching cell 3. This is exactly the same in the case of the conventional example shown in FIG. 9.

In the present embodiment, the compensation signal output by the controller 6 is supplied to the collector terminals of the transistors 16 and 17 that form the RF input cell 2. By inputting the compensation signal to the switching cell 3, the operating current of the switching cell 3 changes. When the compensation signal are Icomp+ and Icomp− and A, B, C, and D are the offset indexes of the transistors 18 to 21, the current ΔIout of the fluctuation caused by the compensation signal in the differential output currents that flow to the output terminals 14 and 15 is given by formula (1).

$$\Delta Iout = (A \cdot (Icomp-) + C \cdot (Icomp+)) - (B \cdot (Icomp-) + D \cdot (Icomp+)) \quad (1)$$

When these offset indexes A, B, C, and D are the same, the current ΔIout is zero. However, when the mixer circuit 1 has second order nonlinear distortion, because the cause of that distortion is mismatch of the transistors 18 to 21 that constitute the switching sell 3, the offset indexes A, B, C, and D have differing values. Accordingly, by appropriately generating the signal value Icomp+, Icomp−, it becomes possible to perform compensation at the mixture output by an amount corresponding to the current quantity ΔIout.

Because the characteristics of second order nonlinear distortion of the mixer circuit 1 differ for each individual element due to manufacturing irregularities, a control terminal 22 is provided in the DC offset compensator 4 in order to adjust the compensation signal generated by the controller 6. That is, the compensation signal can be adjusted appropriately by inputting a control signal from the control terminal 22.

Figure 3:
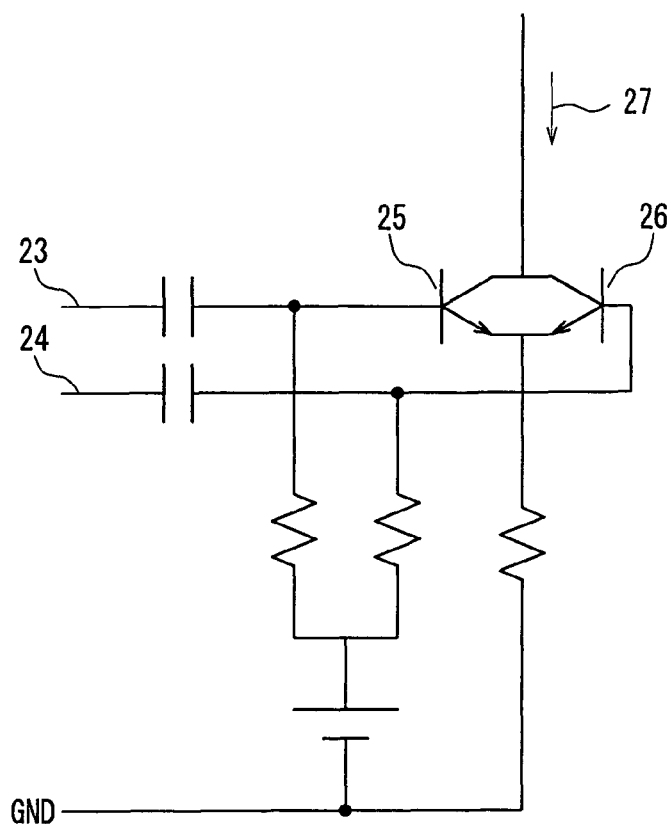
FIG. 3 is a circuit diagram that shows an example configuration of the detector included in the same frequency mixer device.

A specific example configuration of the detector 5 is shown in FIG. 3. In FIG. 3, numerals 23 and 24 indicate RF input lines, connected to the base of transistors 25 and 26. Numeral 27 indicates a detector output current.

Figure 4:
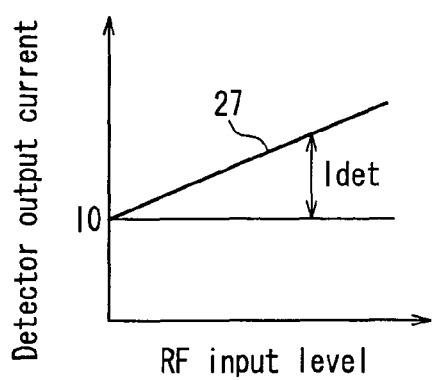
FIG. 4 is a graph that shows the change in the output voltage of the same detector versus RF input level.

In FIG. 4, the horizontal axis shows the RF input level, and the vertical axis shows the level of the detector output current 27. The detector output current 27 is indicated by I0 when the RF input signal is zero. Because of the second order nonlinearity the increased DC currents are generated in the collector currents of the transistors 25 and 26 as the RF input level increases, and the detector output current 27, obtained by adding together with those currents, increases as shown in FIG. 4. Idet is the increased portion of the detector output current 27.

Figure 5:
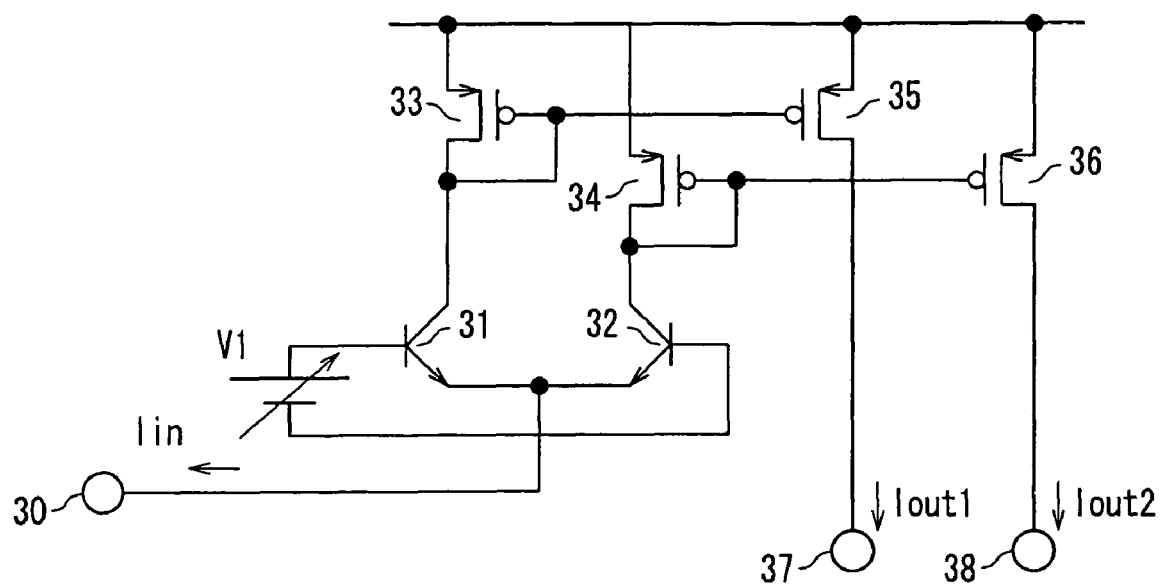
FIG. 5 is a circuit diagram that shows an example configuration of the controller included in the same frequency mixer device.

FIG. 5 shows a specific example configuration of the controller 6. Numeral 30 indicates an input terminal. The transistors 31 and 32 constitute a differential circuit. A ratio of the currents flowing through transistors 31 and 32 is controlled by a control voltage V1 applied between the bases of the transistors 31 and 32. The output of the differential circuit is output as compensation currents Iout1 and Iout2 from output terminals 37 and 38 via P-channel FETs 33, 34, 35, and 36.

The detection current Iin generated in the detector 5 is input from the input terminal 30, driving the currents flowing through the transistors 31 and 32 that constitute a differential circuit. The ratio of the collector currents that flow to the transistors 31 and 32 is controlled by the control voltage V1, and the collector currents of the transistors 31 and 32 are respectively folded by the P-channel FETs 33 and 35 that constitute a current mirror and P-channel FETs 34 and 36, and are output from the output terminals 37 and 38.

The compensation currents Iout1 and Iout2 that are respectively output from the output terminals 37 and 38 are proportional to the level of the detection current Iin that is input from the input terminal 30. When the control voltage V1 is positive, the collector current of the transistor 31 is larger than the collector current of the transistor 32, and the output compensation current Iout1 becomes larger than Iout2. That is, a positive offset is generated in the compensation current difference (Iout1−Iout2). Conversely, when the control voltage V1 is negative, a negative offset is generated in the compensation current difference (Iout1−Iout2). In this way, it is possible to control the amount of offset with the control voltage V1.

Figure 10:
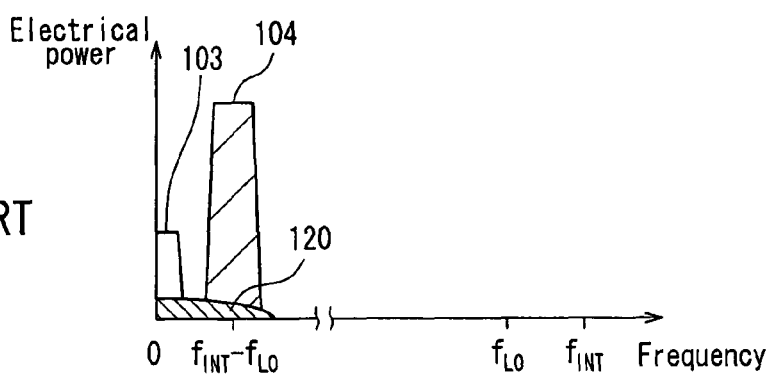
FIG. 10 is a signal spectrum diagram of the mixer output according to the conventional technology.

Ordinarily, low frequency noise is included in the compensation signal that is output from the DC offset compensator 4, and its spectrum, as shown as a noise signal 120 in FIG. 10, has a frequency component that ranges over the desired waveband in the mixer output. On the other hand, in the frequency mixer device of FIG. 2, because the compensation signal is mixed with a local signal in the switching cell 3, low frequency noise included in the compensation signal is converted to a frequency near that of the local signal.

Figure 6:
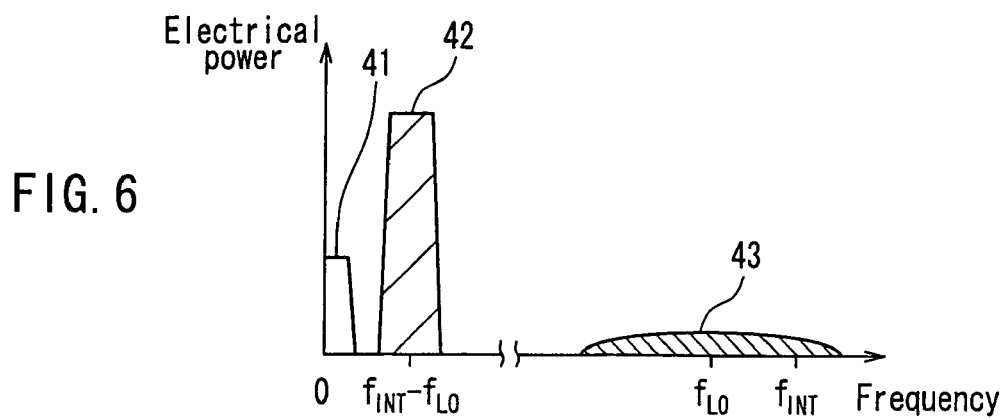
FIG. 6 is a signal spectrum diagram of the mixer output in the same frequency mixer device.
Figure 7:
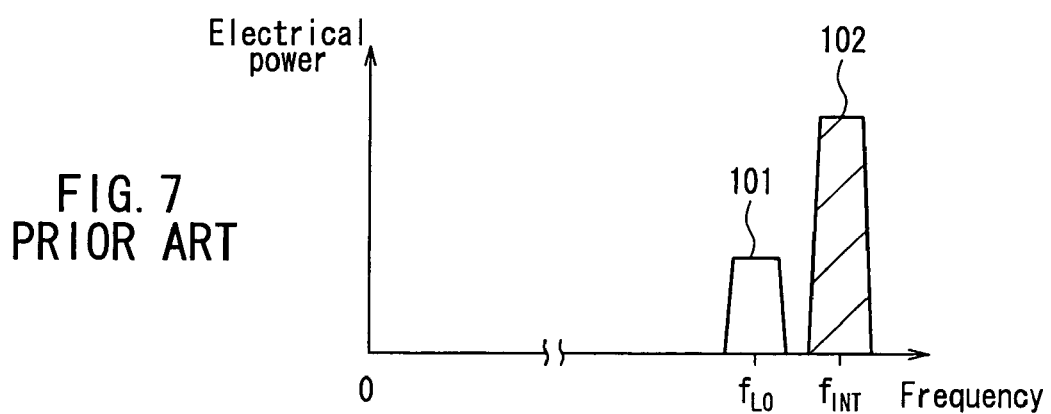
FIG. 7 is a signal spectrum diagram of the mixer input according to the conventional technology.
Figure 8:
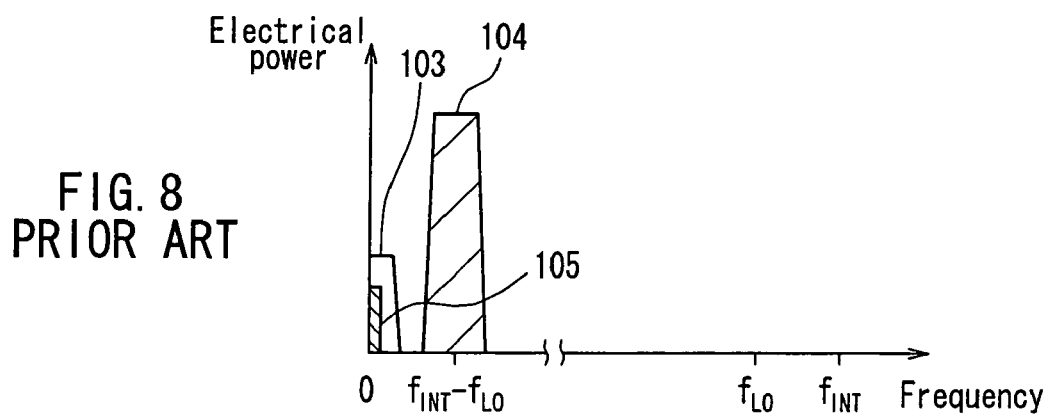
FIG. 8 is a signal spectrum diagram of the mixer output according to the conventional technology when DC offset compensation is not performed.

FIG. 6 shows the output signal spectrum appearing at the output terminals 14 and 15 of the mixer circuit 1. Numerals 41 and 42 respectively indicate the spectrums wherein the frequencies of the desired waveband signal and the interfering waveband signal included in the input RF signal have been converted. Numeral 43 indicates a spectrum wherein the frequency of the low frequency noise included in the compensation signal has been converted. In this way, even if low frequency noise is included in the compensation signal, it will not range over the desired waveband because it is converted to a frequency near that of the local frequency.

With the present embodiment, because low frequency noise does not leak into the mixer output, a noise signal is not superimposed on the desired waveband signal, a DC offset due to a high-level interfering waveband signal can be compensated and degradation of receiver sensitivity is improved greatly.

In the present embodiment, the compensation signal that the DC offset compensator 4 outputs is input to the collector terminals of the transistors 16 and 17 that constitute the RF input cell 2, but the same effect is obtained by inputting the compensation signal to an emitter terminal or a base terminal. Also, by way of example a case was explained in which the transistors constituting the mixer circuit 1 are bipolar transistors, but the mixer circuit 1 may also be configured of MOSFETs.

Further, in the present embodiment a frequency mixer device used for frequency conversion in a direct conversion system was given by way of example, but the present invention is also likewise applicable to other frequency mixer devices having a function that multiplies an input signal and a switching signal.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A frequency mixer device comprising:
   a mixer circuit having an input cell that amplifies an input signal, and a switching cell that mixes the amplified input signal with a switching signal and outputs a multiplied signal; and
   a DC offset compensator that detects the input level of the input signal and outputs a compensation signal based on that detection signal, the compensation signal being supplied to input cell so as to compensate a DC offset included in the multiplied signal.

2. The frequency mixer device according to claim 1, wherein an RF signal is input as the input signal, a local signal is supplied to the switching cell as the switching signal, and an IF signal is output as the multiplied signal from the switching cell.

3. The frequency mixer device according to claim 2, wherein the DC offset compensator comprises: a detector that detects an RF signal and outputs the detection signal; and a controller that receives the detection signal and generates a compensation signal, wherein the controller is adjustable such that the DC offset included in the IF signal is minimized by the compensation signal.

4. The frequency mixer device according to claim 1, wherein the mixer circuit comprises a Gilbert cell.

5. The frequency mixer device according to claim 1, wherein the input cell comprises bipolar transistors into which the input signals are input, so as to compose a bipolar amplifier wherein the amplified input signal is output from a collector terminal of the bipolar transistor.

6. The frequency mixer device according to claim 5, wherein the compensation signal that the DC offset compensator outputs is input to a collector terminal of the bipolar amplifier.

7. The frequency mixer device according to claim 5, wherein the compensation signal that the DC offset compensator outputs is input to an emitter terminal of the bipolar amplifier.

8. The frequency mixer device according to claim 5, wherein the compensation signal that the DC offset compensator outputs is input to a base terminal of the bipolar amplifier.

9. The frequency mixer device according to claim 1, wherein the input cell comprises MOSFETs into which the input signal is input, so as to compose a MOSFET amplifier wherein the amplified input signal is output from a drain terminal of the MOSFET.

10. The frequency mixer device according to claim 9, wherein the compensation signal that the DC offset compensator outputs is input to a drain terminal of the MOSFET amplifier.

11. The frequency mixer device according to claim 9, wherein the compensation signal that the DC offset compensator outputs is input to a source terminal of the MOSFET amplifier.

12. The frequency mixer device according to claim 9, wherein the compensation signal that the DC offset compensator outputs is input to a gate terminal of the MOSFET amplifier.

13. A method for compensating a DC offset included in a multiplied signal obtained by amplifying an input signal by an input cell and mixing the amplified input signal with a switching signal by a switching cell, the method comprising:
   detecting a level of the input signal;
   generating a compensation signal for compensating the DC offset based on the level detection signal;
   supplying the compensation signal to the input cell so as to compensate a DC offset included in the multiplied signal; and
   mixing the output of the input cell with the switching signal by the switching cell, so as to output the multiplied signal.

14. The method for compensating a DC offset according to claim 13, wherein an RF signal is input as the input signal, a local signal is supplied to a switching cell as the switching signal, and an IF signal is output from the switching cell as the multiplied signal.

15. The method for compensating a DC offset according to claim 13, wherein the level of the input signal is detected by a detector to output the level detection signal, the level detection signal is input to a controller to generate the compensation signal that compensates the DC offset included in the multiplied signal, and the controller is capable of being adjusted such that the DC offset included in the output signal is minimized by the adjusting signal.

16. The frequency mixer device of claim 1, wherein the compensation signal is supplied to an input of the input cell.

17. The frequency mixer device of claim 1, wherein the compensation signal is supplied to an output of the input cell.

18. The method of claim 13, wherein the compensation signal is supplied to an input of the input cell.

19. The method of claim 13, wherein the compensation signal is supplied to an output of the input cell.

20. A method for compensating a DC offset included in a multiplied signal obtained from a mixing circuit by amplifying an input signal by an input cell and mixing the amplified input signal with a switching signal by a switching cell, the method comprising:
   detecting a level of the input signal;
   generating a compensation signal for compensating the DC offset based on the level detection signal;
   supplying the compensation signal to the mixing circuit prior to mixing the output of the input cell with the switching signal by the switching cell; and
   mixing the output of the input cell with the switching signal by the switching cell, so as to output the multiplied signal.

* * * * *